(12) United States Patent
Klaren

(10) Patent No.: US 10,951,023 B2
(45) Date of Patent: Mar. 16, 2021

(54) VARIABLE LEVEL POWER CLAMPING CIRCUIT

(71) Applicant: pSemi Corporation, San Diego, CA (US)

(72) Inventor: Jonathan James Klaren, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 16/244,949

(22) Filed: Jan. 10, 2019

(65) Prior Publication Data
US 2020/0227912 A1 Jul. 16, 2020

(51) Int. Cl.
| | | |
|---|---|---|
| *H02H 9/04* | (2006.01) | |
| *H03H 7/38* | (2006.01) | |
| *H03F 3/189* | (2006.01) | |
| *H03F 1/52* | (2006.01) | |
| *H04B 1/16* | (2006.01) | |

(52) U.S. Cl.
CPC ............. *H02H 9/045* (2013.01); *H03F 1/52* (2013.01); *H03F 3/189* (2013.01); *H03H 7/38* (2013.01); *H04B 1/16* (2013.01); *H03F 2200/231* (2013.01); *H03F 2200/294* (2013.01); *H03F 2200/414* (2013.01); *H03F 2200/441* (2013.01); *H03F 2200/451* (2013.01)

(58) Field of Classification Search
CPC .......... H02H 9/046; H02H 9/04; H02H 9/041; H02H 9/042; H02H 3/22; H02H 9/005; H02H 9/044; H02H 5/12; H02H 7/222; H02H 9/048; H03F 2200/453; H03F 1/0222; H03F 1/0261; H03F 1/0266; H03F 1/0277; H03F 1/0288; H03F 1/48; H03F 2200/18
USPC ...................................... 455/232.1
See application file for complete search history.

(56) References Cited

U.S. PATENT DOCUMENTS

| | | |
|---|---|---|
| 8,928,388 B2 | 1/2015 | Lu et al. |
| 9,024,700 B2 | 5/2015 | Ranta |
| 9,197,194 B2 | 11/2015 | Reedy et al. |
| 9,490,647 B2 | 11/2016 | Ju et al. |
| 9,537,472 B2 | 1/2017 | Lu et al. |
| 9,935,678 B1 | 4/2018 | Lu et al. |
| 2009/0195946 A1* | 8/2009 | Kleveland ............ H01L 27/0251 361/56 |

(Continued)

*Primary Examiner* — Ajibola A Akinyemi
(74) *Attorney, Agent, or Firm* — Jaquez Land Greenhaus LLP; John Land, Esq.

(57) ABSTRACT

A variable level power clamping circuit that may be used for the bypass path of an RF receiver having a low-noise amplifier (LNA). Impedance transform circuitry is used to transform the impedance of a signal path to a higher or lower impedance at a clamping circuit, causing the voltage at the clamping circuit to be, respectively, higher (thus clamping at a lower power level) or lower (thus clamping at a higher power level), and then transform the impedance after the clamping circuit to another value, such as to the impedance of the signal path. In a variant embodiment, the clamping circuit and an impedance matching element coupled to an LNA amplification path are re-purposed by selectively connecting those circuit elements to the LNA bypass path through a suitable impedance transform element when in a bypass mode.

12 Claims, 11 Drawing Sheets

(56) References Cited

U.S. PATENT DOCUMENTS

| | | | |
|---|---|---|---|
| 2011/0038083 A1* | 2/2011 | Coln | H01L 27/0255 361/54 |
| 2014/0354357 A1* | 12/2014 | Shrestha | H03F 3/45071 330/252 |
| 2015/0180287 A1* | 6/2015 | Endo | H02M 7/219 307/104 |

* cited by examiner

800

802 — Coupling an impedance transform circuit to the signal path of an RF receiver, the impedance transform circuit having an internal node and being configured to transform the impedance of the coupled signal path to a first impedance at the internal node, and then transform the first impedance at the internal node back to a second impedance on the coupled signal path after the impedance transform circuit 804 — Coupling a power clamping circuit to the internal node of the impedance transform circuit, the power clamping circuit configured to limit power on the coupled signal path and operate at a voltage different from the voltage of the coupled signal path as a result of the action of the impedance transform circuit

```
┌─────────────────────────────────────────┐
│ Coupling an impedance transform circuit │
│ to the bypass path of an RF receiver,   │
│ the impedance transform circuit having  │
│ an internal node and being configured   │
│ to transform the impedance of the       │
│ bypass path to a first impedance at the │──── 902
│ internal node, and then transform the   │
│ first impedance at the internal node    │
│ to a second impedance on the bypass     │
│ path after the impedance transform      │
│ circuit                                 │
└─────────────────────────────────────────┘
                    │
                    ▼
┌─────────────────────────────────────────┐
│ Coupling a power clamping circuit to    │
│ the internal node of the impedance      │
│ transform circuit, the power clamping   │
│ circuit configured to limit power on    │
│ the bypass path and operate at a        │──── 904
│ voltage different from the voltage of   │
│ the bypass path as a result of the      │
│ action of the impedance transform       │
│ circuit                                 │
└─────────────────────────────────────────┘
```

FIG. 9

VARIABLE LEVEL POWER CLAMPING CIRCUIT

BACKGROUND

(1) Technical Field

This invention relates to electronic circuits, and more particularly to power clamping circuits.

(2) Background

Radio frequency (RF) receivers are used in such devices as one-way and two-way radios, including cellular telephones, and in global positioning system (GPS) devices. RF signals received by RF receivers may vary considerably in strength, and consequently it is often necessary to provide protective circuits on receiver inputs to limit power to following circuitry to avoid destruction or malfunction of such circuitry.

For example, many RF receivers are presented with very weak signals (for example, transmitted radio waves captured by an antenna distant from the RF signal transmitter), and accordingly, it is common to use a low-noise amplifier (LNA) to amplify such signals. However, in some cases, such as when an RF receiver is in close proximity to an RF signal transmitter (e.g., a cell tower), the RF signal power may be significant (e.g., at or above about 20 dBm). In such cases, RF signal amplification may be unnecessary, and it is therefore useful to be able to bypass the LNA. However, in both modes of operation, the input signal lines coupled through to following circuitry may need protective circuits.

As a more specific example, FIG. 1 is a schematic diagram of a prior art RF receiver 100 having a passive bypass mode. An RF front-end multipath switch 102 can selectively couple one of one or more $RF_{IN}$ signal lines to an amplification path 104 or to a bypass path 106. The $RF_{IN}$ signal lines may carry, for example, filtered RF signals representing different bands (frequency ranges) from one or more antennas (antennas and filters not shown, but see FIG. 7). $RF_{IN}$ signals switched onto the amplification path 104 are coupled through an impedance matching inductor L1 and relatively large DC blocking capacitor C1 to an LNA 108. The output of the LNA 108 is coupled to a first input of a single-pole, double throw (SPDT) output selection switch 110. $RF_{IN}$ signals switched onto the bypass path 106 are coupled to a second input of the output selection switch 110. The output of the output selection switch 110, $RF_{OUT}$, would be coupled to other RF receiver circuitry (not shown, but see FIG. 7) for conversion to a baseband signal. Other circuitry, not shown, may be included in the RF receiver 100. Some radios may have multiple instances of the RF receiver 100 configured for different frequency ranges or bands.

It is common in RF receiver circuits of the type shown in FIG. 1 to include an input protection circuit coupled to the amplification path 104 to limit signal power to the LNA 108. For example, FIG. 1 shows a clamping circuit 112 coupled in a shunt configuration between the amplification path 104 and a reference potential, such as an RF circuit ground. A common type of clamping circuit is a diode type. For example, FIG. 2A is a schematic diagram showing a first embodiment of the clamping circuit 112 of FIG. 1, comprising back-to-back diodes. FIG. 2B is a schematic diagram showing a second embodiment of the clamping circuit 112 of FIG. 1, comprising back-to-back MOSFETS in a diode-connected configuration (i.e., with drain and gate shorted).

As is known in the art, a diode-type clamping circuit 112 becomes conductive if the voltage applied to its input exceeds a threshold value. For a fixed-impedance system, such as 50 ohms (typical of modern RF systems), the voltage threshold corresponds to an equivalent power threshold. A MOSFET-based clamping circuit 112 will typically begin clamping at a lower power level than a diode-based clamping circuit 112. For example, in one common implementation technology, a diode-based clamping circuit 112 will begin clamping at about 10 dBm of input power (with respect to a 1 dBm compression point) and limit $RF_{OUT}$ to about 14 dBm with $RF_{IN}$ at about 20 dBm. Under the same fabrication conditions, a MOSFET-based clamping circuit 112 will begin clamping at about 2 dBm of input power (with respect to a 1 dBm compression point) and limit $RF_{OUT}$ to about 8 dBm with $RF_{IN}$ at about 20 dBm.

A notable advantage of a diode-type clamping circuit 112 in the RF receiver 100 is that in non-limiting operation, the clamping circuit 112 presents little or no added impedance or distortion to the signal on the amplification signal path 104. This is so because the voltage of a desired received RF signal is too small to trigger the nonlinear clamping characteristic of a diode-type clamping circuit 112; this allows the LNA 108 to operate linearly on the desired received RF signal. A diode-type clamping circuit 112 presents some parasitic load (undesired capacitance), but that load may be made small enough in modern semiconductor technology to not significantly degrade the operation of the LNA 108 on the desired received RF signal. Further, diode-type clamping circuits are simple and consume little circuit area. However, there are numerous other clamping circuits known in the art that are suitable for use with RF receiver circuits of the type shown in FIG. 1.

Referring again to FIG. 1, the bypass path 106 as illustrated does not include a clamping circuit. Accordingly, the full power of an $RF_{IN}$ signal may be coupled through to following RF receiver circuitry. One way of limiting the power at $RF_{OUT}$ to protect following circuitry would be to include a clamping circuit coupled in a shunt configuration between the bypass path 106 and a reference potential, such as an RF circuit ground. However, in some RF applications, there is a need to limit power at $RF_{OUT}$ to less than about 8 dBm, a level that cannot be achieved in RF systems having a 50-ohm characteristic impedance with many implementation technologies using a conventional diode-type clamping circuit.

Accordingly, there is a need for a clamping circuit that can limit output power to less than about 8 dBm, and especially to about 7 dBm or less, at a power input level of about 20 dBm in RF systems having a 50-ohm characteristic impedance. The present invention meets this need and provides other functionality and benefits.

SUMMARY

The present invention encompasses impedance transform circuitry used to transform the impedance of an RF signal path to a higher or lower impedance at a clamping circuit, causing the voltage at the clamping circuit to be, respectively, higher (thus clamping at a lower power level) or lower (thus clamping at a higher power level), and then transform the impedance on the signal path after the transform circuitry to another value, such as back to the impedance of the signal path before the transform circuitry. Embodiments of the invention encompass a variable level power clamping circuit that is well adapted for use for the bypass path of an RF receiver circuit and which can limit output power to less than about 8 dBm, and especially to about 7 dBm or less, at a power input level of about 20 dBm in RF systems having a 50-ohm characteristic impedance.

In a first embodiment configured for use in an RF receiver having a bypassable LNA, a clamping circuit is coupled in a shunt configuration between a reference potential (such as an RF circuit ground) and an impedance transform circuit series coupled to the bypass path of the RF receiver.

In a second embodiment configured for use in an RF receiver having a bypassable LNA, a clamping circuit and an impedance matching element coupled to the signal path to an LNA are selectively re-purposed by switchably connecting those circuit elements to the bypass path through a suitable impedance transform element when the RF receiver is set to a bypass mode.

The details of one or more embodiments of the invention are set forth in the accompanying drawings and the description below. Other features, objects, and advantages of the invention will be apparent from the description and drawings, and from the claims.

DESCRIPTION OF THE DRAWINGS

FIG. 8 is a process flow chart showing one method for clamping power on a signal path of an RF receiver.

FIG. 9 is a process flow chart showing one method for clamping power on a bypass path of an RF receiver having a low-noise amplifier.

Like reference numbers and designations in the various drawings indicate like elements.

DETAILED DESCRIPTION

Figure 1:
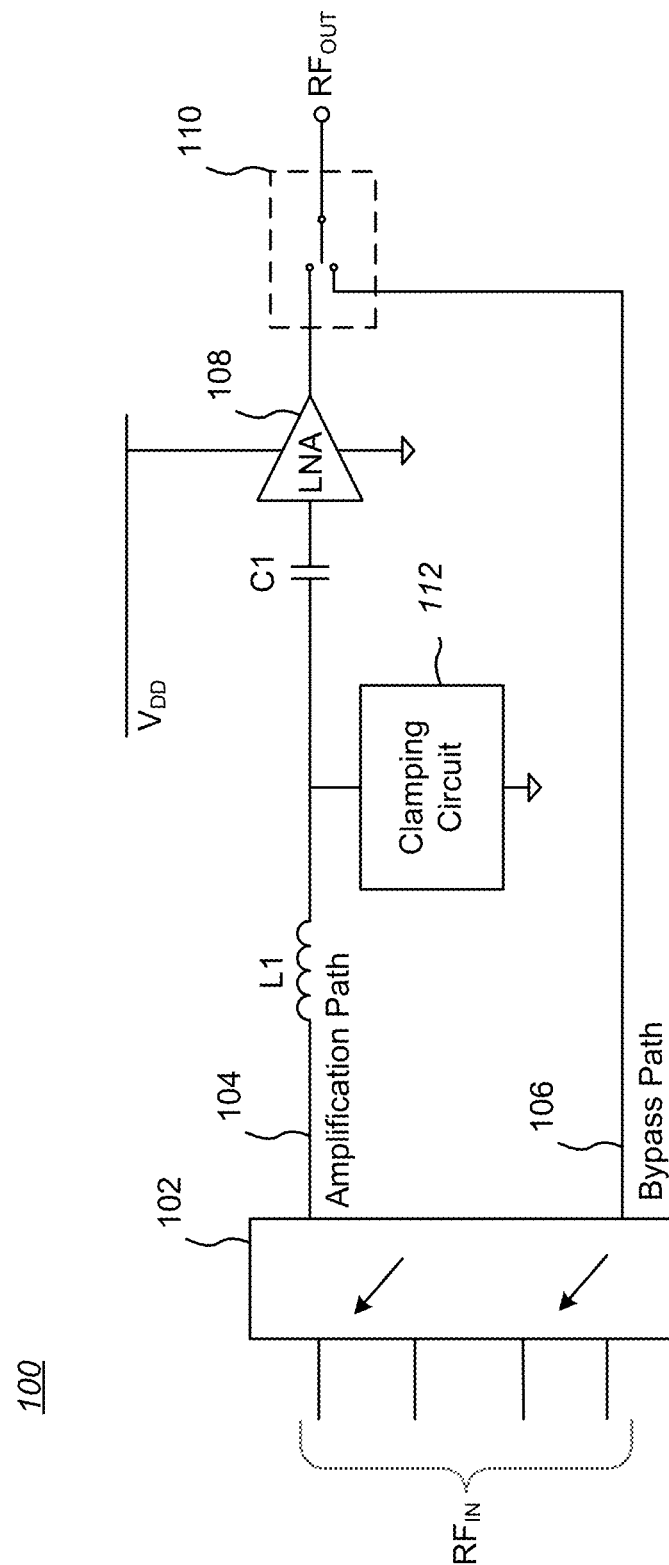
FIG. 1 is a schematic diagram of a prior art RF receiver having a passive bypass mode.

The present invention encompasses impedance transform circuitry used to transform the impedance of an RF signal path to a higher or lower impedance at a clamping circuit, causing the voltage at the clamping circuit to be, respectively, higher (thus clamping at a lower power level) or lower (thus clamping at a higher power level), and then transform the impedance on the signal path after the transform circuitry to another value, such as back to the impedance of the signal path before the transform circuitry. Embodiments of the invention encompass a variable level power clamping circuit that is well adapted for use for the bypass path of an RF receiver and which can limit output power to less than about 8 dBm, and especially to about 7 dBm or less, at a power input level of about 20 dBm in RF systems having a 50-ohm characteristic impedance.

One insight to the inability of conventional clamping circuits to limit $RF_{OUT}$ power on the bypass path of an RF receiver to less than about 8 dBm for an $RF_{IN}$ power of about 20 dBm in RF systems having a 50-ohm characteristic impedance was that the voltage at a diode-type clamping circuit was too low and that the clamping voltage threshold of such circuits is constrained by device physics. The voltage at which a clamping circuit begins to compress depends on two factors: (1) the physical properties of the semiconductor device (i.e., forward-bias voltage of a diode, or threshold voltage of a MOSFET), and (2) the impedance at the node to which the clamping circuit is connected. The first factor is fixed in a semiconductor process over which a circuit designer typically has no control. However, the second factor is completely under the control of the circuit designer.

More specifically, it was realized that impedance transform circuitry could be used to transform the impedance of a signal path in an RF receiver to a higher impedance at a clamping circuit, causing the voltage at the clamping circuit to be higher (thus clamping at a lower power level), and then re-transform to another value, such as back to the impedance of the signal path before the transform circuitry. It was further realized that impedance transform circuitry could be used to transform the impedance of a signal path to a lower impedance at a clamping circuit, causing the voltage at the clamping circuit to be lower (thus clamping at a higher power level), and then re-transform in to another value, such as back to the impedance of the signal path before the transform circuitry. Moreover, by including one or more variable inductances and/or capacitances in the impedance transform circuitry, the impedance transform circuitry and clamping circuit would essentially comprise a variable level power clamping circuit. Accordingly, a circuit designer is not limited to the specific clamping voltage of a particular clamping circuit, but can customize the compression characteristic of a clamping circuit by using suitable impedance transformations to meet the needs of particular applications.

In a first embodiment configured for use in an RF receiver having a bypassable LNA, a clamping circuit is coupled in a shunt configuration between a reference potential (such as an RF circuit ground) and an impedance transform circuit series coupled to the bypass path of the RF receiver.

In a second embodiment configured for use in an RF receiver having a bypassable LNA, a clamping circuit and an impedance matching element coupled to the signal path to an LNA are selectively re-purposed by switchably connecting those circuit elements to the bypass path through a suitable impedance transform element when the RF receiver is set to a bypass mode.

First Embodiment

Figure 2B:
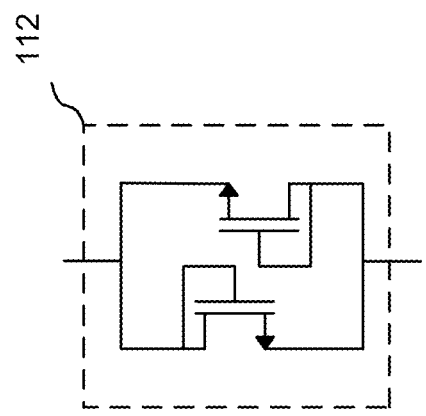
FIG. 2B is a schematic diagram showing a second embodiment of the clamping circuit of FIG. 1, comprising back-to-back MOSFETS in a diode-connected configuration (i.e., with drain and gate shorted).
Figure 2A:
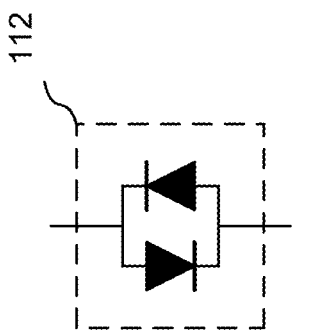
FIG. 2A is a schematic diagram showing a first embodiment of the clamping circuit of FIG. 1, comprising back-to-back diodes.
Figure 3:
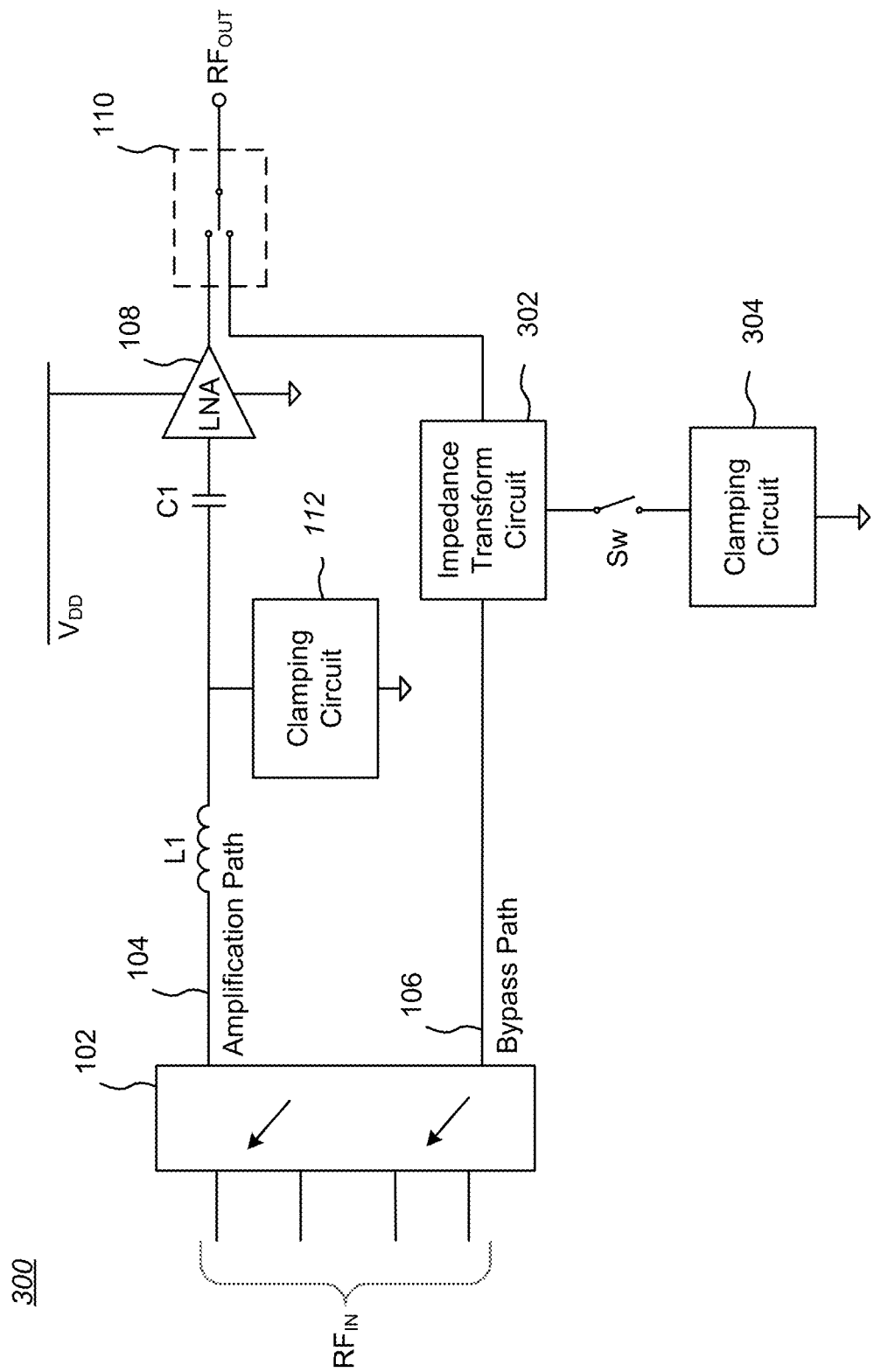
FIG. 3 is a block diagram of a first embodiment of a variable level power clamping circuit configured for use on the bypass path of an RF receiver having an LNA amplification path.

FIG. 3 is a block diagram of a first embodiment of a variable level power clamping circuit configured for use on the bypass path of an RF receiver 300 having an LNA amplification path. The overall circuit is similar to the RF receiver 100 of FIG. 1, but further includes an impedance transform circuit 302 coupled in series with the bypass path 106. An active or passive clamping circuit 304 is coupled to the impedance transform circuit 302 by an optional switch Sw. The clamping circuit 304 may be, for example, one of the types shown in FIG. 2A or FIG. 2B. Examples of other clamping circuits may be found in U.S. Pat. Nos. 9,935,678, 9,537,472, 9,490,647, and 8,928,388, all assigned to the assignee of the present invention and hereby incorporated by reference.

The switch Sw allows the bypass path 106 to be switched between a non-limited, by-pass-only configuration when open, and to a power limited "bypass and limit" configuration when closed. The switch Sw may be implemented, for example, as a MOSFET or MEMS switch.

The impedance transform circuit 302 may be implemented in a number of ways that transform the impedance of the coupled signal path to a different impedance at the clamping circuit 304, and re-transform that different impedance to another impedance on the signal path after the clamping circuit 304 (which may be, for example, back to the impedance of the signal path before the impedance transform circuit 302). For example, the impedance transform circuit 302 may be series connected, or shunt connected, or a combination of series-shunt connected reactive elements. Examples of other implementations of the impedance transform circuit 302 include multi-winding inductors and distributed quarter-wave transmission lines. For purposes of limiting the output power of the bypass path 106 of an RF receiver to less than about 8 dBm (and especially to about 7 dBm or less) at a power input level of about 20 dBm in RF systems having a 50-ohm characteristic impedance, the "different impedance" at the clamping circuit 304 should be higher than the characteristic impedance of the bypass path 106.

Figure 4B:
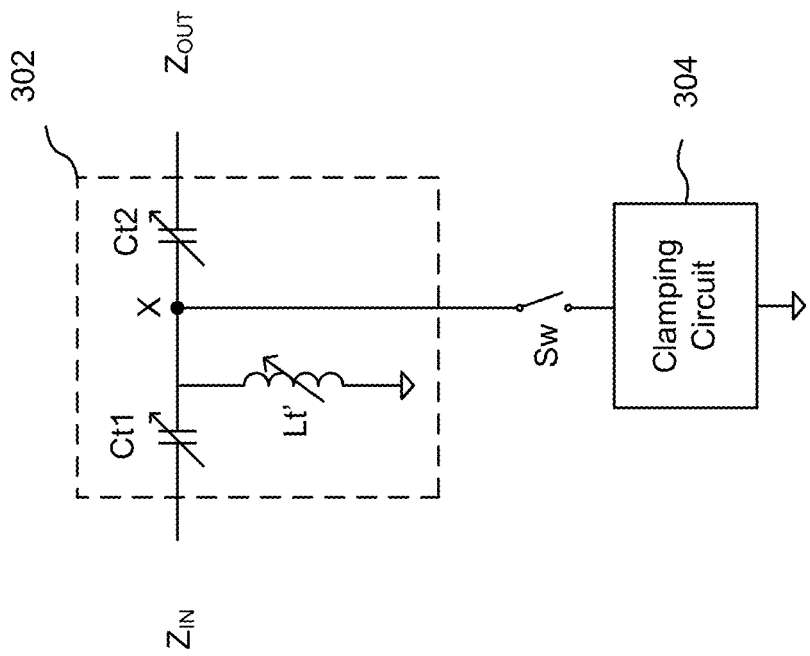
FIG. 4B is a block diagram showing a series-shunt type impedance transform circuit coupled to the switch Sw and clamping circuit of FIG. 3.
Figure 4A:
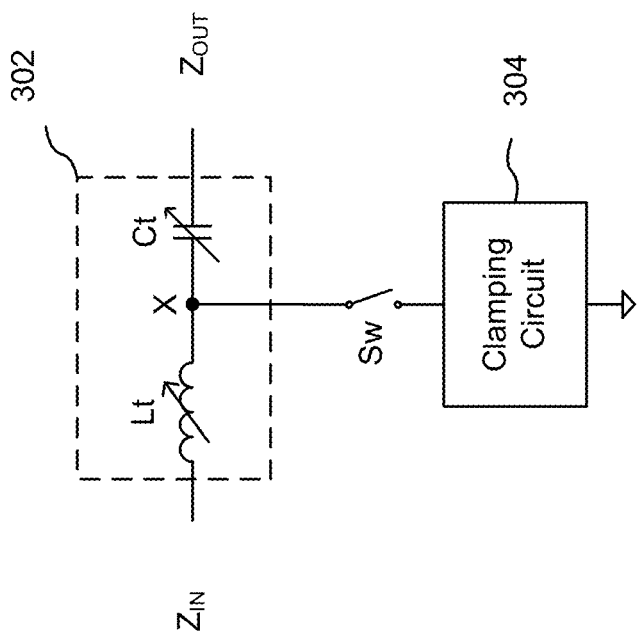
FIG. 4A is a block diagram showing a series type impedance transform circuit coupled to the switch Sw and clamping circuit of FIG. 3.

FIG. 4A is a block diagram showing a series type impedance transform circuit 302 coupled to the switch Sw and clamping circuit 304 of FIG. 3. The illustrated impedance transform circuit 302 comprises an inductor Lt series coupled in series with a capacitor Ct. The inductor Lt and the capacitor Ct are, in turn, series coupled to a signal path (e.g., bypass path 106). To achieve the power limiting characteristics of the example in the previous paragraph, the inductor Lt transforms the impedance of the bypass path 106 at $Z_{IN}$ to a higher impedance at internal node X (e.g., 4 to 5 times higher). In this example, the capacitor Ct re-transforms the higher impedance at internal node X back to the impedance of the bypass path 106 at $Z_{OUT}$. When coupled by switch Sw in a "bypass and limit" configuration, the clamping circuit 304 can clamp $RF_{OUT}$ for the RF receiver 300 of FIG. 3 to less than about 8 dBm, and especially to about 7 dBm or less for an $RF_{IN}$ power level of about 20 dBm in RF systems having a 50-ohm characteristic impedance.

Note that in a purely 50 ohm system, the impedance transformation is not directionally dependent, meaning that the order of the inductor Lt and the capacitor Ct can be reversed. In the example shown in FIG. 4A, the higher impedance is achieved by combining the positive reactance of the inductor Lt with the offsetting negative reactance of the capacitor Ct. If the inductor Lt and the capacitor Ct are reversed in order, then the higher impedance is achieved by combining the negative reactance of the capacitor Ct with the offsetting positive reactance of the inductor Lt.

As another example, FIG. 4B is a block diagram showing a series-shunt type impedance transform circuit 302 coupled to the switch Sw and clamping circuit 304 of FIG. 3. The illustrated impedance transform circuit 302 comprises a first capacitor Ct1 series coupled in series with a second capacitor Ct2. The capacitors Ct1, Ct2 are, in turn, series coupled to a signal path (e.g., bypass path 106). An inductor Lt' is coupled between a reference potential, such as an RF circuit ground, and a junction between the first capacitor Ct1 and the second capacitor Ct2. For the same power limiting example from above, the first capacitor Ct1 transforms the impedance of the bypass path 106 at $Z_{IN}$ to a higher impedance at internal node X. The inductor Lt' and the second capacitor Ct2 re-transforms the higher impedance at internal node X back to the impedance of the bypass path 106 at $Z_{OUT}$. More technically, if plotted on a Smith chart, the first capacitor Ct1 transforms the impedance (Z=R) of the bypass path 106 to a different (and higher) impedance (Z=R−jX), the inductor Lt' transforms the different impedance to the conjugate of the different impedance (i.e., to Z=R+jX), and the second capacitor Ct2 transforms that conjugate impedance back to the original impedance (in this example, to the impedance of the bypass path 106, Z=R). When coupled by switch Sw in a "bypass and limit" configuration, the clamping circuit 304 can clamp $RF_{OUT}$ for the RF receiver 300 of FIG. 3 to less than about 8 dBm, and especially to about 7 dBm or less for an $RF_{IN}$ power level of about 20 dBm in RF systems having a 50-ohm characteristic impedance.

Figure 4C:
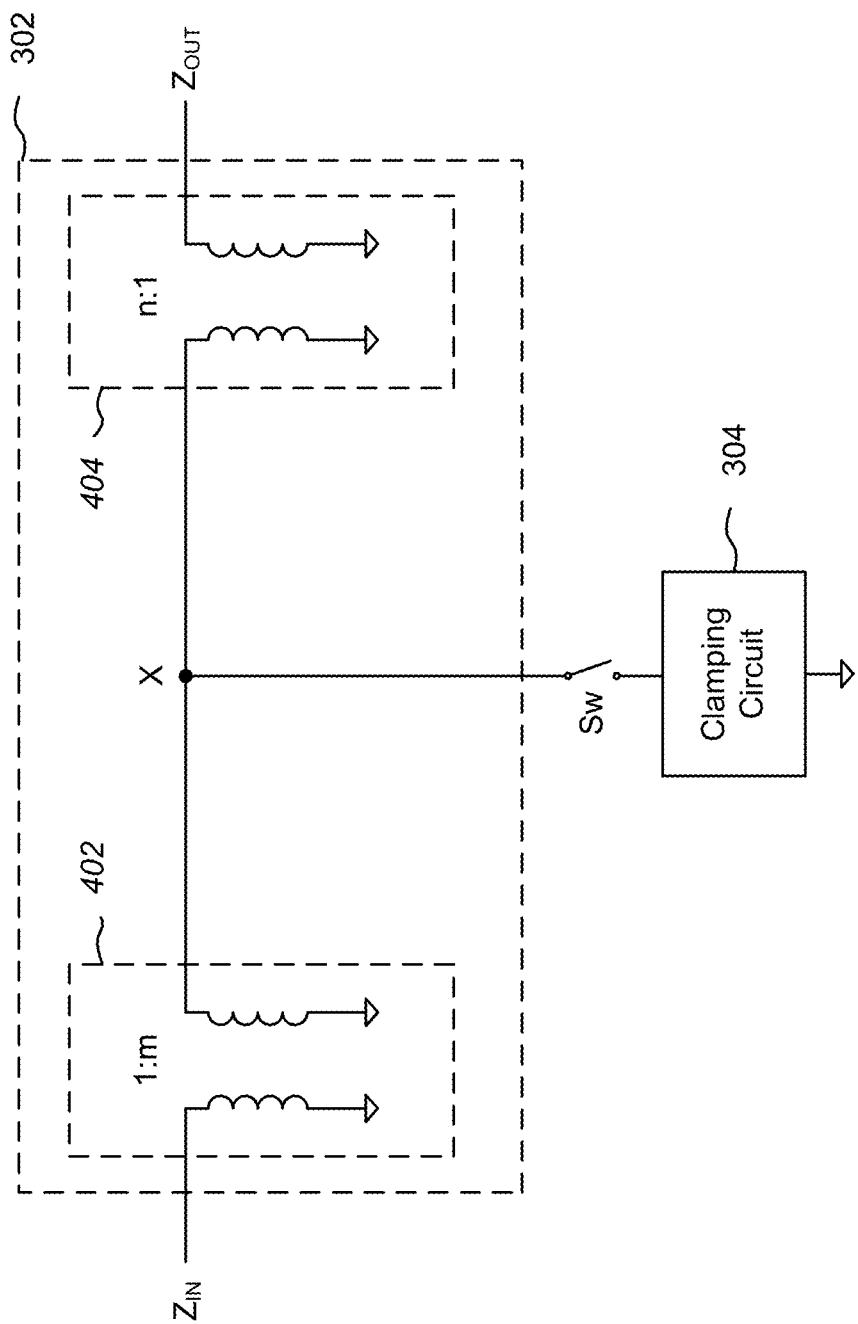
FIG. 4C is a block diagram showing a generalized impedance transform circuit suitable for transforming the impedance at $Z_{IN}$ to a first transformed impedance at node X, and then to a second transformed impedance at $Z_{OUT}$.

In embodiments of the types shown in FIGS. 4A and 4B, the impedance transform circuit 302 may be configured to transform the impedance of the coupled signal path to a different impedance at the clamping circuit 304, and re-transform that different impedance back to the impedance of the signal path before the impedance transform circuit 302. However, the re-transformed impedance on the signal path after the impedance transform circuit 302 need not match the impedance on the signal path before the impedance transform circuit 302—that is, $Z_{IN}$ need not equal $Z_{OUT}$. Further, the impedance transform circuit 302 may be other than as shown in FIGS. 4A and 4B. For example, FIG. 4C is a block diagram 400 showing a generalized impedance transform circuit 302 suitable for transforming the impedance at $Z_{IN}$ to a first transformed impedance $Z_X$ at node X, and then to a second transformed impedance at $Z_{OUT}$. More specifically, the impedance presented at $Z_{IN}$ is transformed by a 1:m impedance transformer 402 to a different, first transformed impedance $Z_X$ at node X, where "m" is a multiplier that may be greater than 1 (to increase the impedance at node X) or less than 1 (to decrease the impedance at node X). The switch Sw and clamping circuit 304 behave as described above. The impedance $Z_X$ at node X is transformed by an n:1 impedance transformer 404 to a second, different transformed impedance at $Z_{OUT}$, where "n" is a multiplier that may be less than 1 or greater than 1. In general, $Z_{IN}$ need not equal $Z_{OUT}$.

The impedance transformers 402 and 404 in FIG. 4C are represented symbolically as coupled inductor coils, but as noted above, either or both of the impedance transformers 402, 404 may be series connected reactive elements, shunt connected reactive elements, a combination of series-shunt connected reactive elements, multi-winding inductors, distributed quarter-wave transmission lines, or any other impedance transform elements and/or circuits.

In many applications, the "n" multiplier is selected to cause a transformation in an opposite direction to the "m" multiplier. For example, if "m" is selected to increase the impedance from $Z_{IN}$ to node X, then "n" is selected to decrease the impedance from node X to $Z_{OUT}$. However, in some applications, embodiments of the invention may be used to provide an impedance transformation from a low input impedance $Z_{IN}$ to a significantly higher output impedance $Z_{OUT}$, or vice versa, where the intermediate impedance $Z_X$ may be lower or higher than $Z_{IN}$. For example, it may be useful to provide a variable level power clamping circuit in a signal pathway from an amplifier chain at 50 ohms to an analog-to-digital converter impedance at 500 ohms. Transforming the impedance $Z_X$ at node X to an impedance in between the $Z_{IN}$ and $Z_{OUT}$ impedances might offer a preferred operating voltage threshold for the clamping circuit 304 while still implementing the desired impedance transform.

By way of example, TABLE 1 below shows five different cases of transformations by different impedance transform circuit 302 configurations, where m=f($Z_{IN}$, $Z_X$) and n=f($Z_X$, $Z_{OUT}$).

TABLE 1

| Case | $Z_{IN}$ | m | $Z_X$ | n | $Z_{OUT}$ | Transform Sequence |
|---|---|---|---|---|---|---|
| 1 | 50 | 2 | 200 | 2 | 50 | Up-Down $Z_{IN} = Z_{OUT}$ |
| 2 | 50 | 1.6818 | 141 | 0.59460 | 400 | Up-Up $Z_{IN} < Z_{OUT}$ |
| 3 | 400 | 0.7071 | 200 | 1.4142 | 100 | Down-Down $Z_{IN} > Z_{OUT}$ |
| 4 | 50 | 0.7071 | 25 | 0.7071 | 50 | Down-Up $Z_{IN} = Z_{OUT}$ |
| 5 | 50 | 0.7071 | 25 | 0.35355 | 200 | Down-Up $Z_{IN} < Z_{OUT}$ |

Thus, most generally, the impedance transform circuit 302 has an internal node X and is configured to transform the impedance $Z_{IN}$ of a coupled signal path before the impedance transform circuit 302 to a first impedance $Z_X$ at the internal node X, and then transform the first impedance $Z_X$ at the internal node X to a second impedance $Z_{OUT}$ on the coupled signal path after the impedance transform circuit 302.

The circuit shown in FIG. 4A may be preferred for many integrated circuit applications because the inductor Lt will generally be smaller than the inductor Lt' of the circuit of FIG. 4B. The inductances and/or capacitances of the impedance transform circuits 302 of FIG. 4A and FIG. 4B may have fixed values, or may be implemented as variable circuit elements, as illustrated. A variable impedance transform circuit allows the same circuit to vary the voltage at internal node X in FIGS. 4A-4C, thus varying the clamping threshold and limits of the clamping circuit 304. Variability may be by selecting one of several possible values at the time of manufacture (e.g., by cutting or forming links, blowing fuses, etc.), or programmatically setting values, such as by using digitally tunable capacitors (DTC) and/or a digitally tunable inductors (DTLs). Examples of DTCs may be found in U.S. Pat. No. 9,024,700, issued on May 5, 2015, entitled "*Method and Apparatus for use in Digitally Tuning a Capacitor in an Integrated Circuit Device*", assigned to the assignee of the present invention and hereby incorporated by reference. Examples of DTLs may be found in U.S. Pat. No. 9,197,194, issued on Nov. 24, 2015, entitled "*Method and Apparatus for Use in Tuning Reactance in an Integrated Circuit Device*", assigned to the assignee of the present invention and hereby incorporated by reference.

As should be appreciated by one of ordinary skill in the art, other impedance transform circuits 302 could be utilized to transform the impedance of a signal line to a different (higher or lower) impedance at an internal node (e.g., internal node X in FIGS. 4A-4C) and then transform the impedance at the internal node to another impedance, such as back to the impedance of the signal line, or to a uniquely different impedance level. Such transformation allows a power clamping circuit, coupled to an internal node of the impedance transform circuit, to limit power on a coupled signal path and operate at a voltage different from the voltage of the coupled signal path. Varying the amount of impedance transformation results in a variable level power clamping circuit.

EXAMPLES

Figure 5:
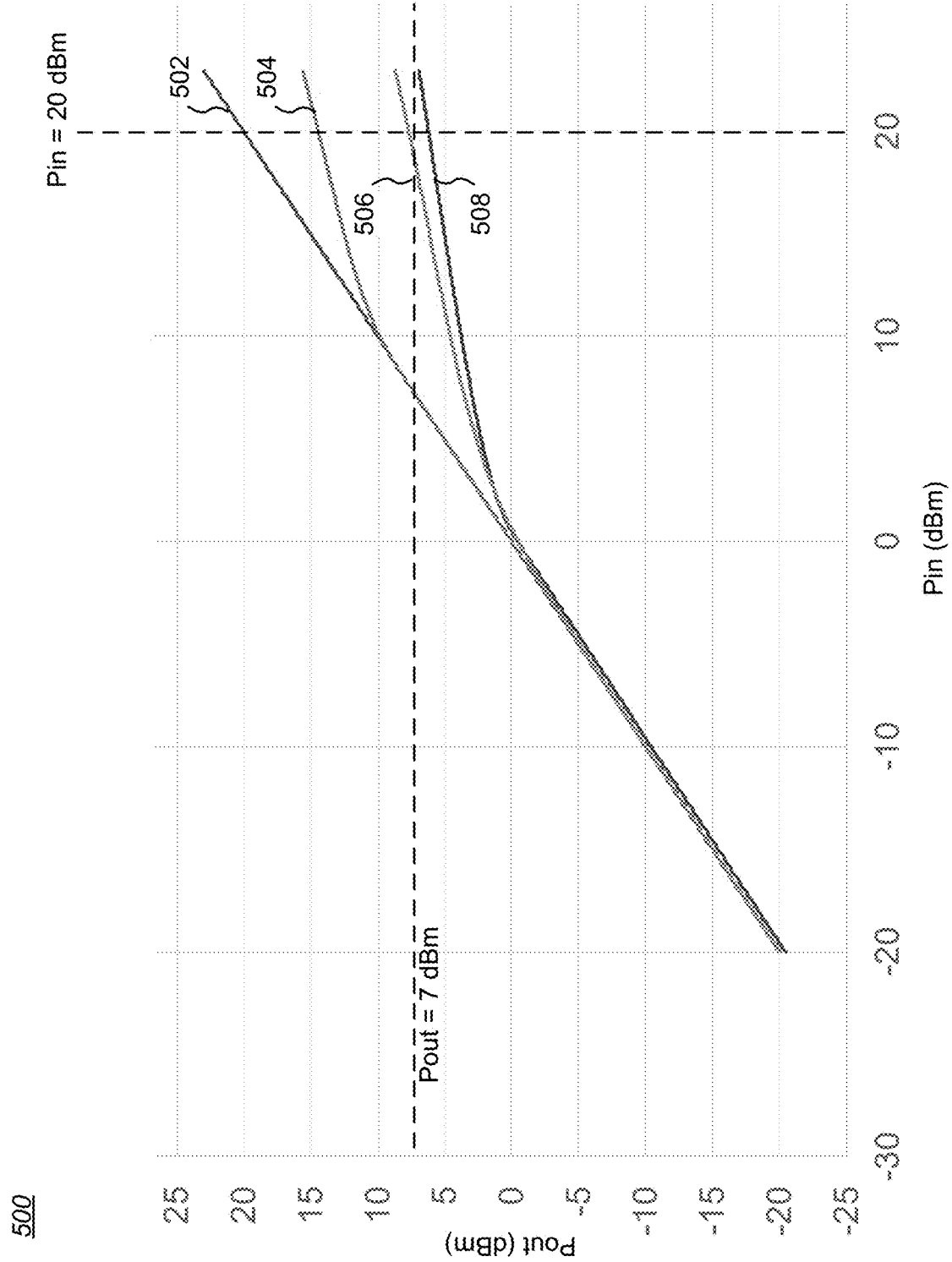
FIG. 5 is a graph showing power out (Pout) as a function of power in (Pin) for various simulations of an LNA bypass path having different power clamping circuit configurations.

FIG. 5 is a graph 500 showing power out (Pout) as a function of power in (Pin) for various simulations of an LNA bypass path having different power clamping circuit configurations. Graph curve 502 shows an LNA bypass path having no power limiting circuit, as in the circuit of FIG. 1, resulting in Pout mirroring Pin. Graph curve 504 shows an LNA bypass path having a diode-based clamping circuit (e.g., the circuit of FIG. 2A) directly connected to the LNA bypass path, resulting in limiting Pout beginning at about 12.3 dBm of input power with respect to a 1 dBm compression point, with a Pout limit of about 14 dBm for Pin of about 20 dBm (also of note: the graph curve does not converge at higher input power levels). Graph curve 506 shows an LNA bypass path having a MOSFET-based clamping circuit (e.g., the circuit of FIG. 2B) directly connected to the LNA bypass path, resulting in limiting Pout beginning at about 2.9 dBm of input power with respect to a 1 dBm compression point, with a Pout limit of about 8 dBm for Pin of about 20 dBm.

Graph curve 508 shows an LNA bypass path having a diode-based clamping circuit (e.g., the circuit of FIG. 2A) connected to the LNA bypass path of the circuit of FIG. 3 through an impedance transform circuit of the type shown in FIG. 4A. In this simulation, for a frequency of 960 MHz, the value of the inductor Lt was set to about 20 nH and the value of the capacitor Ct was set to about 1.37 pF, resulting in an impedance Z at internal node X of 50 ohms+j120 ohms; accordingly, |Z|=130 ohms. The result is that Pout is limited beginning at about 2 dBm of input power with respect to a 1 dBm compression point, with a Pout limit of less than 7 dBm for Pin of about 20 dBm. It is expected that using a MOSFET-based clamping circuit (e.g., the circuit of FIG. 2B) connected to the LNA bypass path through an impedance transform circuit would result in even more limitation of Pout for Pin of about 20 dBm, but with a lower limiting trigger level. It is also expected that a MOSFET-based clamping circuit, which already limits the power to a lower level in 50-ohm characteristic impedance systems, would need less adjustment than a diode-based clamping circuit. As a result, the impedance would not need to be transformed to as high a value for the required 7 dBm compression for Pout. This means that the inductor (e.g., Lt or Lt') in the impedance transform circuit 302 could be smaller than with a diode-based clamping circuit, which provides important space savings in integrated circuit embodiments.

In general terms, the transformed impedance at the internal node X of an impedance transform circuit can be approximated by considering the characteristics of a particularly implementing embodiment and a desired clamping power level. For example, for an impedance transform circuit 302 based on back-to-back diodes (e.g., the circuit of FIG. 2A), assume that the diodes clamp at Vclamp=1V. The clamping power Pclamp=½ Vclamp$^2$/|Z|, and accordingly the combined real and imaginary impedance components $|Z|=\frac{1}{2}$ Vclamp$^2$/Pclamp, where Pclamp is expressed in Watts. (The complex impedance has real and imaginary components, Z=R+jX; the magnitude of this impedance, $|Z|=\text{sqrt}(R^2+X^2)$, is used for this computation. Note that conversion of power in Watts to dBm would be common for RF applications, using PdBm=10*log(Pwatts)+30).

For an input power of Pin=20 dBm, and a clamping target level of about 10 dBm, the transformed impedance at the internal node X of an impedance transform circuit would be about 50 ohms. Similarly, for a clamping target level of about 7 dBm, the transformed impedance at the internal node X of an impedance transform circuit would be about 100 ohms, and for a clamping target level of about 4 dBm, the transformed impedance at the internal node X of an impedance transform circuit would be about 200 ohms.

Note that the diode clamp curve 504 indicates compression higher than the computed 10 dBm value for an impedance of 50 ohm—that is, the simulation showed clamping at about 14.5 dBm with Pin=+20 dBm. It is believed that this discrepancy results from the following factors: (1) neither diode (nor MOSFET) clamp circuits actually clamp perfectly abruptly as to strictly limit the peak voltage; the peak voltage will exceed 1V in the diode case; (2) the input wave form shape starts to differ from sinusoidal once its peaks are clipped—the integral $(1/T\ v(t)^2/|Z|)dt$ will give a larger value for power than $\frac{1}{2}$Vpeak$^2$/|Z|; and (3) the clamping power expression Pclamp=$\frac{1}{2}$Vclamp$^2$/|Z| is a limit on the linear power, after which compression begins—as shown in FIG. 5, the slope of the Pout vs Pin graph curves 504, 506, 508 are far from zero (i.e., they are still increasing with Pin).

Second Embodiment

The RF receiver circuit embodiment shown in FIG. 3 includes two clamping circuits 112, 304, coupled respectively to the amplification path 104 and to the bypass path 106. A clever variant of that embodiment repurposes the diode-type clamping circuit 112 and the impedance matching inductor L1 by selectively connecting those circuit elements to the bypass path 106 through an added impedance transform element when the RF receiver is set to a bypass mode.

Figure 6:
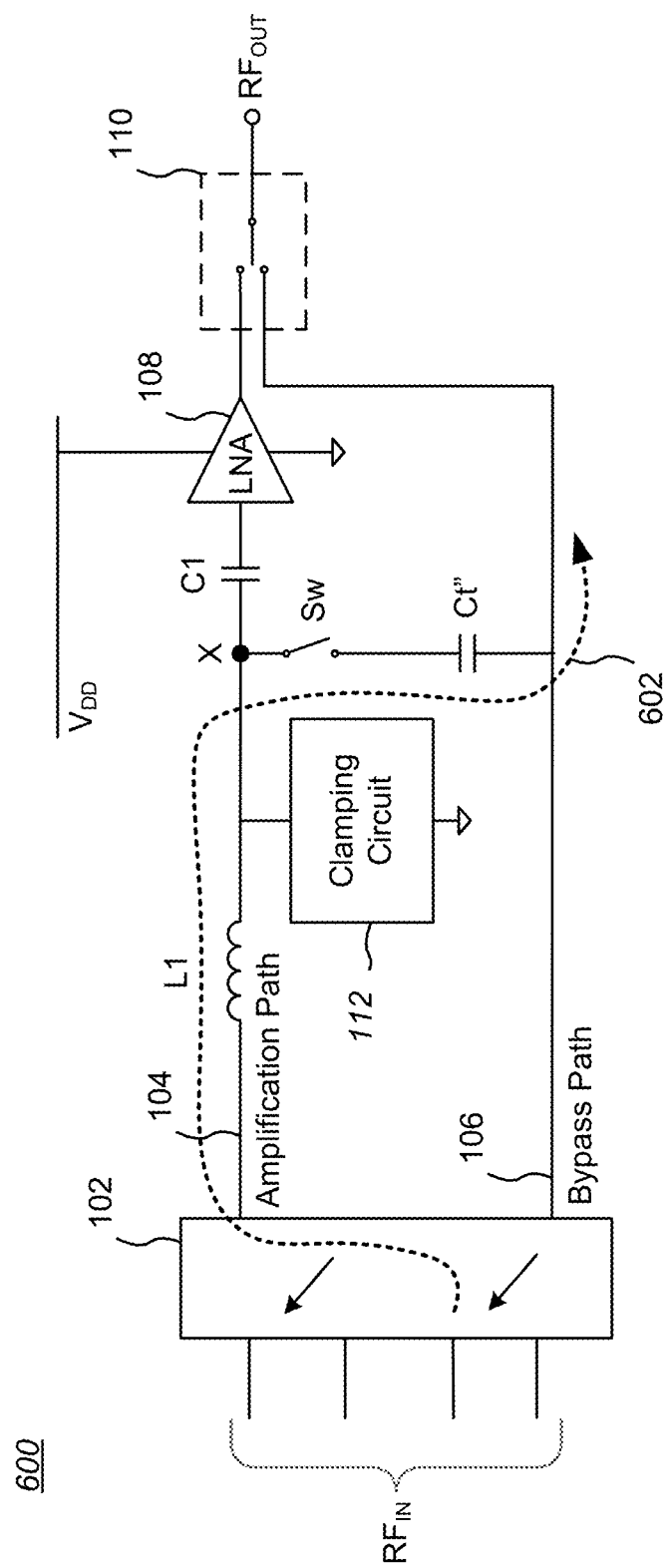
FIG. 6 is a block diagram of a second embodiment of a variable level power clamping circuit for the bypass path of an RF receiver.

For example, FIG. 6 is a block diagram of a second embodiment of a variable level power clamping circuit for the bypass path of an RF receiver 600. The overall circuit is similar to the RF receiver 100 of FIG. 1, but further includes a series-coupled switch Sw and a capacitor Ct" in a shunt configuration between the amplification path 104 and the bypass path 106 such that the diode-type clamping circuit 304 is connected between the inductor L1 and the capacitor Ct". The capacitor Ct" may have a fixed value or may be a variable capacitor (e.g., a DTC).

When only bypass is required for the bypass path 106 (i.e., no limiting), the multipath switch 102 is configured to switch a selected RF$_{IN}$ signal line through to the bypass path 106, while concurrently switch Sw is opened and the output selection switch 110 is set to select the bypass path 106. Any signal from the multipath switch 102 is directly applied to the bypass path 106 and passes to the output selection switch 110, bypassing the LNA 108.

When both bypass and limiting are required, the multipath switch 102 is configured to switch a selected RF$_{IN}$ signal line through to the amplification path 104, while concurrently switch Sw is closed, the amplifier 108 is disabled, and the output selection switch 110 is set to select the bypass path 106. Thus, no signal is directly applied to the bypass path 106 through the multipath switch 102. Instead, RF signals from the selected signal line pass through the inductor L1, the closed switch Sw, the capacitor Ct", and the output selection switch 110, thus bypassing the LNA 108 (see dotted line 602 in FIG. 6 as one example of the signal flow path). The combination of the inductor L1 and the capacitor Ct" function as a series type impedance transform circuit. In this example, the upstream inductor L1 transforms the impedance of the amplification path 104 to a higher impedance at internal node X (but it could be to a lower impedance in other embodiments). In this example, the downstream capacitor Ct" re-transforms the impedance at internal node X back to the impedance of the bypass path 106 (but it could be to a different impedance). As so configured, the diode-type clamping circuit 112 can clamp RF$_{OUT}$ for the RF receiver of FIG. 3 to less than about 8 dBm, and especially to about 7 dBm or less, for an RF$_{IN}$ power level of about 20 dBm in RF systems having a 50-ohm characteristic impedance.

A benefit of the example embodiment shown in FIG. 6 is the re-use of the existing diode-type clamping circuit 112, thus saving circuit area.

Applications

Embodiments of the present invention may be used in a variety of devices or electronic systems that include radio frequency (RF) transceivers and/or receivers; examples include personal computers, tablet computers, wireless network components, televisions, cable system "set top" boxes, radar systems, and cellular telephones. Radio devices and systems in particularly includes wireless RF systems (including base stations, relay stations, and hand-held transceivers or receivers) that use various technologies and protocols, including various types of orthogonal frequency-division multiplexing ("OFDM"), quadrature amplitude modulation ("QAM"), Code Division Multiple Access ("CDMA"), Wide Band Code Division Multiple Access ("WCDMA"), Worldwide Interoperability for Microwave Access ("WIMAX"), Global System for Mobile Communications ("GSM"), Enhanced Data Rates for GSM Evolution (EDGE), Long Term Evolution ("LTE"), as well as other radio communication standards and protocols.

Many RF transceivers are quite complex two-way radios that transmit and receive RF signals across multiple frequencies in multiple bands using one or more signaling protocols. As an example, a modern "smartphone" may include RF transceiver circuitry capable of operating on different cellular communications systems (e.g., GSM, WCDMA, and LTE), on different wireless network frequencies and protocols (e.g., cellular frequency bands, and IEEE 802.11 abgn at 2.4 GHz and 5 GHz), and on local and "personal" area networks (e.g., WiFi, Bluetooth based systems). Signal strengths of such frequencies and protocols may vary widely, requiring LNAs in some cases, and bypassing LNAs in other cases. The present invention is particularly well-suited to protect circuitry downstream from an LNA when the LNA is in a bypass configuration.

Figure 7:
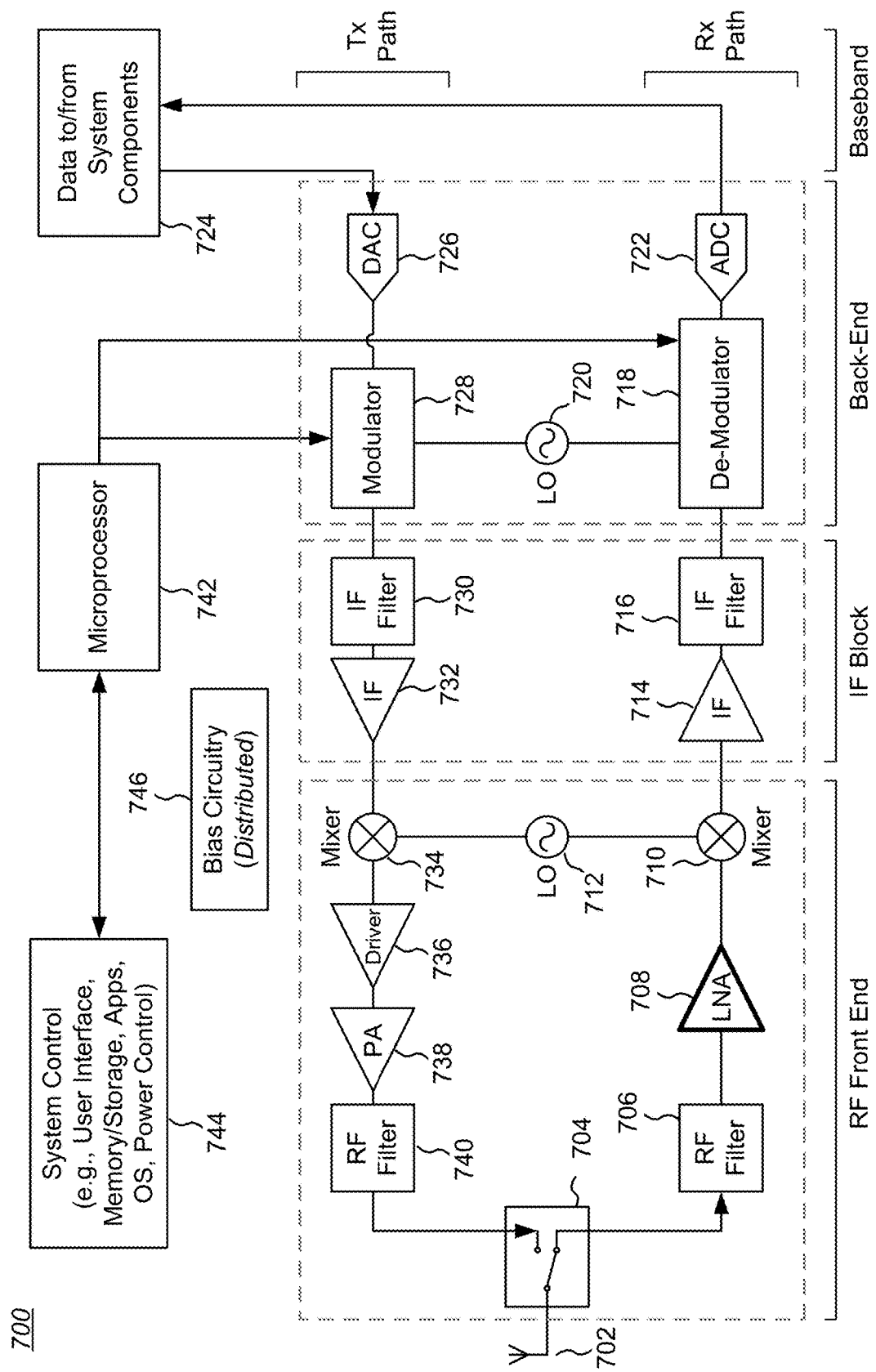
FIG. 7 is a block diagram of a transceiver that might be used in an RF device, such as a cellular telephone, and which may beneficially use embodiments of the present invention.

FIG. 7 is a block diagram of a transceiver 700 that might be used in an RF device, such as a cellular telephone, and which may beneficially use embodiments of the present invention. As illustrated, the transceiver 700 includes a mix of RF analog circuitry for directly conveying and/or transforming signals on an RF signal path, non-RF analog circuitry for operational needs outside of the RF signal path (e.g., for bias voltages and switching signals), and digital circuitry for control and user interface requirements. In this example, a receiver path Rx includes RF Front End, IF Block, Back-End, and Baseband sections (noting that in some implementations, the differentiation between sections may be different).

The receiver path Rx receives over-the-air RF signals through an antenna 702 and a switching unit 704, which may be implemented with active switching devices (e.g., field effect transistors or FETs), or with passive devices that implement frequency-domain multiplexing, such as a diplexer or duplexer. An RF filter 706 passes desired received RF signals to a low noise amplifier (LNA) 708, the output of which is combined in a mixer 710 with the output of a first local oscillator 712 to produce an intermediate frequency (IF) signal. As should be clear, the LNA 708 may have a bypassable configuration, and utilize the power limiting circuitry described above and illustrated, by way of example only, in FIGS. 3 and 6. The IF signal may be amplified by an IF amplifier 714 and subjected to an IF filter 716 before being applied to a demodulator 718, which may be coupled to a second local oscillator 720. The demodulated output of the demodulator 718 is transformed to a digital signal by an analog-to-digital converter 722 and provided to one or more system components 724 (e.g., a video graphics circuit, a sound circuit, memory devices, etc.). The converted digital signal may represent, for example, video or still images, sounds, or symbols, such as text or other characters.

In the illustrated example, a transmitter path Tx includes Baseband, Back-End, IF Block, and RF Front End sections (again, in some implementations, the differentiation between sections may be different). Digital data from one or more system components 724 is transformed to an analog signal by a digital-to-analog converter 726, the output of which is applied to a modulator 728, which also may be coupled to the second local oscillator 720. The modulated output of the modulator 728 may be subjected to an IF filter 730 before being amplified by an IF amplifier 732. The output of the IF amplifier 732 is then combined in a mixer 734 with the output of the first local oscillator 712 to produce an RF signal. The RF signal may be amplified by a driver 736, the output of which is applied to a power amplifier (PA) 738. The amplified RF signal may be coupled to an RF filter 740, the output of which is coupled to the antenna 702 through the switching unit 704.

The operation of the transceiver 700 is controlled by a microprocessor 742 in known fashion, which interacts with system control components (e.g., user interfaces, memory/storage devices, application programs, operating system software, power control, etc.). In addition, the transceiver 700 will generally include other circuitry, such as bias circuitry 746 (which may be distributed throughout the transceiver 700 in proximity to transistor devices), electrostatic discharge (ESD) protection circuits, testing circuits (not shown), factory programming interfaces (not shown), etc.

In modern transceivers, there are often more than one receiver path Rx and transmitter path Tx, for example, to accommodate multiple frequencies and/or signaling modalities. Further, as should be apparent to one of ordinary skill in the art, some components of the transceiver 700 may be in a positioned in a different order (e.g., filters) or omitted. Other components can be (and usually are) added (e.g., additional filters, impedance matching networks, variable phase shifters/attenuators, power dividers, etc.).

Methods

Another aspect of the invention includes methods for clamping power on a signal path of a circuit, including clamping power on a bypass path of an RF receiver circuity having a low-noise amplifier and clamping power on a signal path to a low-noise amplifier.

For example, FIG. 8 is a process flow chart showing one method for clamping power on a signal path of an RF receiver. The method includes: coupling an impedance transform circuit to the signal path of the RF receiver, the impedance transform circuit having an internal node and being configured to transform the impedance of the coupled signal path to a first (generally different) impedance at the internal node, and then transform the first impedance at the internal node back to a second impedance on the coupled signal path after the impedance transform circuit (Block 802); and coupling a power clamping circuit to the internal node of the impedance transform circuit, the power clamping circuit configured to limit power on the coupled signal path and operate at a voltage different from the voltage of the coupled signal path as a result of the action of the impedance transform circuit (Block 804).

As another example, FIG. 9 is a process flow chart showing one method for clamping power on a bypass path of an RF receiver having a low-noise amplifier. The method includes: coupling an impedance transform circuit to the bypass path of the RF receiver, the impedance transform circuit having an internal node and being configured to transform the impedance of the bypass path to a first impedance at the internal node, and then transform the first impedance at the internal node to a second impedance on the bypass path after the impedance transform circuit (Block 902); and coupling a power clamping circuit to the internal node of the impedance transform circuit, the power clamping circuit configured to limit power on the bypass path and operate at a voltage different from the voltage of the bypass path as a result of the action of the impedance transform circuit (Block 904).

Figure 10:
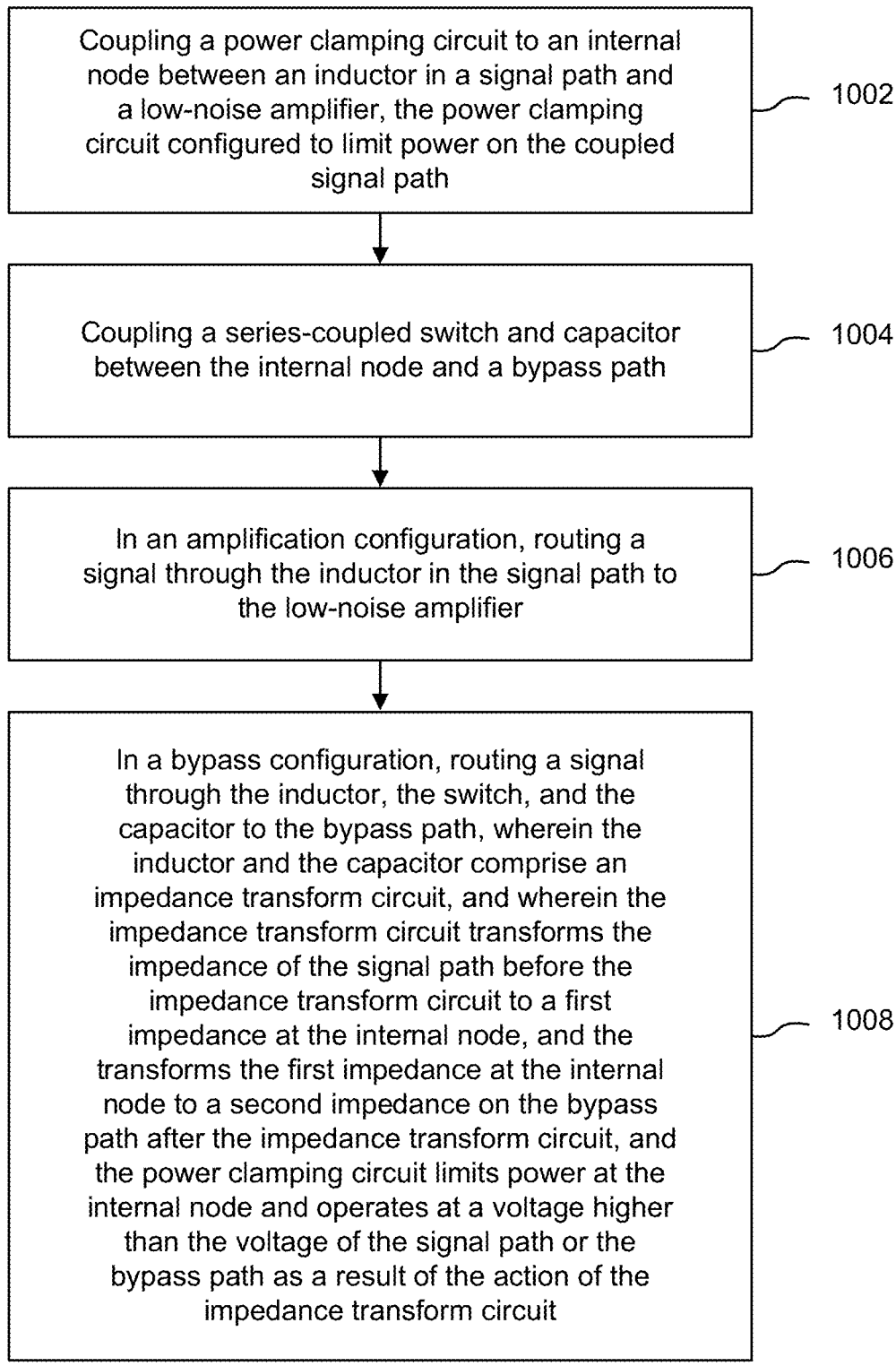
FIG. 10 is a process flow chart showing one method for clamping power on a signal path of an RF receiver having a low-noise amplifier.

As yet another example, FIG. 10 is a process flow chart showing one method for clamping power on a signal path of an RF receiver having a low-noise amplifier. The method includes: coupling a power clamping circuit to an internal node between an inductor in a signal path and a low-noise amplifier, the power clamping circuit configured to limit power on the coupled signal path (Block 1002); coupling a series-coupled switch and capacitor between the internal node and a bypass path (Block 1004); in an amplification configuration, routing a signal through the inductor in a signal path to a low-noise amplifier (Block 1006); and in a bypass configuration, routing a signal through the inductor, the switch, and the capacitor to the bypass path, wherein the inductor and the capacitor comprise an impedance transform circuit, and wherein the impedance transform circuit transforms the impedance of the signal path before the impedance transform circuit to a first impedance at the internal node, and the transforms the first impedance at the internal node to a second impedance on the bypass path after the impedance transform circuit, and the power clamping circuit limits power at the internal node and operates at a voltage higher than the voltage of the signal path or the bypass path as a result of the action of the impedance transform circuit (Block 1008).

In various embodiments, one or more of the above methods may include, without limitation, one or more of the following characteristics and/or additional elements: wherein the different impedance at the internal node is higher than the input impedance; wherein the different impedance at the internal node is lower than the input impedance; wherein the power clamping circuit is a diode-based clamping circuit; wherein the power clamping circuit is a diode-connected MOSFET-based clamping circuit;

wherein the impedance transform circuit is a variable impedance transform circuit; wherein the impedance transform circuit is one of a series type impedance transform circuit, or a shunt type impedance transform circuit, or a series-shunt type impedance transform circuit; wherein the impedance transform circuit includes at least one variable inductance and/or capacitance; further including selectively coupling the power clamping circuit to the internal node of the impedance transform circuit.

Fabrication Technologies & Options

As used in this specification, the term "radio frequency" (RF) refers a rate of oscillation in the range of about 3 kHz to about 300 GHz. This term also includes the frequencies used in wireless communication systems. An RF frequency may be the frequency of an electromagnetic wave or of an alternating voltage or current in a circuit.

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

Circuits and devices in accordance with the present invention may be used alone or in combination with other components, circuits, and devices. Embodiments of the present invention may be fabricated in whole or in party as integrated circuits (ICs), which may be encased in IC packages and/or or modules for ease of handling, manufacture, and/or improved performance.

As should be readily apparent to one of ordinary skill in the art, various embodiments of the invention can be implemented to meet a wide variety of specifications. The inductors and/or capacitors in the various embodiments may be fabricated on an IC "chip", or external to such a chip and coupled to the chip in known fashion. The values for the inductors and capacitors generally will be determined by the specifications for a particular application, taking into account such factors as RF frequency bands, the natural limiting voltage of the clamping circuit, system requirements for saturated output power and expected level of large input signals, etc.

Unless otherwise noted above, selection of suitable component values is a matter of design choice and various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS processes enables circuits with low power consumption, the ability to withstand high power signals during operation due to FET stacking, good linearity, and high frequency operation (i.e., radio frequencies above about 1 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Conclusion

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A radio-frequency receiver having a low-noise amplifier and including:
    (a) an output selection switch having a first input, a second input, and an output;
    (b) a low-noise amplifier coupled to the first input of the output selection switch;
    (c) an amplification path coupled to the low-noise amplifier;
    (d) a bypass path coupled to the second input of the output selection switch;
    (e) a multipath switch, coupled to the amplification path and to the bypass path and configured to be coupled to one or more radio frequency (RF) signal lines, for selectively coupling one of the RF signal lines to the amplification path or to the bypass path;
    (f) an impedance transform circuit, coupled to the bypass path and including an internal node, configured to transform the impedance of the bypass path to a first impedance at the internal node, and then transform the impedance at the internal node to a second impedance on the bypass path after the impedance transform circuit; and
    (g) a power clamping circuit, coupled to the internal node of the impedance transform circuit, for limiting power on the bypass path and operating at a voltage different from the voltage of the bypass path as a result of the action of the impedance transform circuit.

2. The invention of claim 1, wherein the first impedance at the internal node is higher than the impedance of the bypass path.

3. The invention of claim 1, wherein the first impedance at the internal node is lower than the impedance of the bypass path.

4. The invention of claim 1, wherein the power clamping circuit is a diode-based clamping circuit.

5. The invention of claim 1, wherein the power clamping circuit is a diode-connected MOSFET-based clamping circuit.

6. The invention of claim 1, wherein the impedance transform circuit is a variable impedance transform circuit.

7. The invention of claim 1, wherein the impedance transform circuit is one of a series type impedance transform circuit, or a shunt type impedance transform circuit, or a series-shunt type impedance transform circuit.

8. The invention of claim 1, wherein the impedance transform circuit includes at least one variable inductance and/or capacitance.

9. A radio-frequency receiver having a low-noise amplifier and including:
   (a) an output selection switch having a first input, a second input, and an output;
   (b) a low-noise amplifier coupled to the first input of the output selection switch;
   (c) an amplification path coupled to the low-noise amplifier;
   (d) an inductor series coupled to the amplification path at an internal node on the amplification path between the inductor and the low-noise amplifier;
   (e) a bypass path coupled to the second input of the output selection switch;
   (f) a multipath switch, coupled to the inductor and to the bypass path and configured to be coupled to one or more radio frequency (RF) signal lines, for selectively coupling one of the RF signal lines to the inductor or to the bypass path;
   (g) a switch coupled to the internal node;
   (h) a capacitor coupled to the switch and to the bypass path; and
   (i) a power clamping circuit coupled to the internal node;
   wherein when the switch is open, the power clamping circuit limits power on the amplification path to the low-noise amplifier, and
   wherein when the switch is closed, (1) signals on an RF signal line selected by the multipath switch are coupled through the inductor, the amplification path, the switch, and the capacitor to the bypass path; (2) the inductor and the capacitor comprise an impedance transform circuit wherein the impedance transform circuit transforms the impedance of the amplification path to a first impedance at the internal node, and the capacitor transforms the first impedance at the internal node to a second impedance on the bypass path after the impedance transform circuit; and (3) the power clamping circuit limits power at the internal node and operates at a voltage higher than the voltage of the amplification path or the bypass path as a result of the action of the impedance transform circuit.

10. The invention of claim 9, wherein the power clamping circuit is a diode-based clamping circuit.

11. The invention of claim 9, wherein the power clamping circuit is a diode-connected MOSFET-based clamping circuit.

12. The invention of claim 9, wherein the capacitor is a variable capacitor.

* * * * *